(12) United States Patent
Sano et al.

(10) Patent No.: US 6,252,248 B1
(45) Date of Patent: Jun. 26, 2001

(54) THIN FILM TRANSISTOR AND DISPLAY

(75) Inventors: Keiichi Sano, Anpachi-gun; Yasuo Segawa, Gifu; Norio Tabuchi, Ichinomiya; Tsutomu Yamada, Motosu-gun, all of (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/326,288

(22) Filed: Jun. 7, 1999

(30) Foreign Application Priority Data

Jun. 8, 1998 (JP) .................................................. 10-159131

(51) Int. Cl.[7] ........................... H01L 29/04; H01L 31/21; H01L 31/036; H01L 31/0376
(52) U.S. Cl. ................................. 257/59; 257/72; 257/350
(58) Field of Search ................................ 257/57, 59–60, 257/66, 72, 350; 349/42–44, 46

(56) References Cited

U.S. PATENT DOCUMENTS

| | | | |
|---|---|---|---|
| 5,548,153 | * 8/1996 | Muragishi | 257/365 |
| 5,644,146 | * 7/1997 | Arai et al. | 257/66 |
| 5,754,261 | * 5/1998 | Lyu | 349/44 |
| 5,796,116 | * 8/1998 | Nakata et al. | 257/66 |
| 5,834,797 | * 11/1998 | Yamanaka | 257/57 |
| 5,955,765 | * 9/1999 | Yamazaki et al. | 257/365 |
| 5,965,916 | * 10/1999 | Chen | 257/347 |
| 5,966,193 | * 10/1999 | Zhang et al. | 349/110 |
| 6,034,747 | * 3/2000 | Tanaka et al. | 349/43 |

* cited by examiner

Primary Examiner—Ngân V. Ngô
(74) Attorney, Agent, or Firm—Cantor Colburn LLP

(57) ABSTRACT

A gate electrode (2), a gate insulating film (3), and an active layer (4) made of a poly silicon film and having a source (5), a channel (7), and a drain (6) are formed on an insulating substrate (1) and an interlayer insulating film (9) is formed over the whole of the gate insulating film (3), the active layer (4), and a stopper insulating film (8). A drain electrode (10) is formed by filling a contact hole made in the interlayer insulating film (9), the position of which corresponds to the drain (6), with a metal, such as Al. Simultaneously with the drain electrode (10), a conductive layer (11) is formed on the interlayer insulating film (9) over the channel (7). The conductive layer (11) is connected to gate signal line G on the insulating substrate (1) via a contact hole (15) made in the gate insulating film (3) and the interlayer insulating film (9). The width of the conductive layer (11) along the length of the channel (7) is narrower than the actual length of the channel (7) and narrower than the width along the channel length of the gate electrode (2). The conductive layer (11) can therefore shield the channel (7). As a result, even if impurities or the like become attached to the surface of the interlayer insulating film (9), the occurrence of a back channel, for example, is reliably prevented.

28 Claims, 5 Drawing Sheets

THIN FILM TRANSISTOR AND DISPLAY

BACKGROUND OF THE INVENTION

1. Field of the Invention

This invention relates to a thin film transistor (TFT) having an insulating film and to a display having such a TFT as a switching element.

2. Description of the Prior Art

In recent years TFTs having a poly silicon film as an active layer have been developed as a driver element or a pixel driving element for use in various displays, such as an active-matrix liquid crystal display (LCD).

An LCD having a conventional TFT will be described below.

FIG. 1 is a plan view of a conventional TFT used in a display pixel section; FIG. 2 is a cross-sectional view along E—E line in FIG. 1 of an LCD using such a TFT.

As shown in FIG. 1, the TFT in the pixel section is formed near the intersection of gate signal line G for providing gate signals and drain signal line D for providing image signals, and its source is connected to a display electrode.

The structure of such a TFT will be described with reference to FIG. 2.

A gate electrode 2 made of a refractory metal (high melting point metal), such as chromium (Cr) and molybdenum (Mo), a gate insulating film 3, and an active layer 4 made of a poly silicon film are formed in that order on an insulating substrate 1 made of quartz glass, non-alkaline glass, or the like.

In the active layer 4, a channel 7 is formed over the gate electrode 2 and a source 5 and a drain 6 are formed with the channel 7 between by ion doping with a stopper insulating film 8 on the channel 7 as a mask.

An interlayer insulating film 9 consisting of an $SiO_2$ film, an SiN film, and an $SiO_2$ film layered is formed over the whole of the gate insulating film 3, active layer 4, and stopper insulating film 8. Furthermore, a drain electrode 10 is formed by filling a contact hole made in the interlayer insulating film 9 at a position corresponding to the drain 6, with a metal, such as Al. In addition, a planarization film 12 made of, for example, an organic resin for planarization the surface is formed entirely over the interlayer insulating film 9. A contact hole, at a position corresponding to the source 5, is made in the planarization film 12. Furthermore, a display electrode 13, which is a transparent electrode and also serves as a source electrode, made of ITO (indium tin oxide) being in contact with the source 5 via this contact hole is formed on the planarization film 12. An alignment film 14 made of an organic resin, such as polyimide, for aligning liquid crystal 24 is formed over the display electrode 13.

The insulating substrate 1 on which the TFT is formed, and an opposite substrate 20 having an opposite electrode 21 and an alignment film 22 opposite to the insulating substrate 1, are bonded together at their edges with a sealing adhesive 23 and a vacant space formed is filled with liquid crystal 24.

In the structure of such a conventional TFT, however, impurities or impurity ions generated when the sealing adhesive hardens, water or impurity ions included in the liquid crystal 24, water permeating from the outside through a gap 25 occurring when the sealing adhesive 23 comes off, water included in the air coming in contact with the planarization film 12 (alignment film 14 for a display portion in an LCD), or other substances become attached to the surface of the planarization film 12, so that electric charge occurs on the surface of the planarization film 12 and polarization occurs between the top and the bottom of the planarization film 12 or each film of the interlayer insulating film 9.

Therefore, a back channel is formed in a TFT, resulting in the disadvantage of a change in a threshold voltage of the TFT.

Furthermore, if such a TFT is used in an LCD, an increase in a threshold voltage of the TFT leads to a decrease in an ON-state current of the TFT and, conversely, a decrease in a threshold voltage of the TFT leads to an increase in an OFF-state current of the TFT. If such a TFT is used as a pixel switching element in, for example, a normally-white mode LCD, a bright point defect, in which some pixels remain permanantly bright, may occur in these cases. As a result, image display is of poor quality. In addition, if a threshold voltage varies from TFT to TFT, there exists the disadvantage of being unable to obtain display having uniform brightness all over.

SUMMARY OF THE INVENTION

The present invention was made to overcome the above conventional disadvantages. That is, an object of the present invention is to provide an LCD being capable of displaying images with uniform brightness all over by preventing polarization in a planarization film or an interlayer insulating film of a TFT, stabilizing a threshold voltage of the TFT, and improving the bright point defect and others.

A TFT according to the present invention is a thin film transistor in which a gate electrode, a gate insulating film, a semiconductor film having a channel, an interlayer insulating film, and a planarization insulation film are formed on an insulating substrate, a conductive layer is formed on one of the interlayer insulating film and the planarization insulation film over the channel, the width of the conductive layer along the length of the channel is narrower than the channel length, and the edge along the channel length of the conductive layer does not overlap with the edge along the channel length of the gate electrode or the edge along the channel length of the channel.

A TFT according to another aspect of the present invention is a thin film transistor in which a gate electrode, a gate insulating film, a semiconductor film having a channel, and an interlayer insulating film are formed on an insulating substrate, a conductive layer is formed opposite to the channel in the semiconductor film with, at least, the interlayer insulating film between, and the width of the conductive layer along the length of the channel is narrower than the channel length and than the width along the channel length of the gate electrode.

In a semiconductor device according to the present invention, a gate signal line, a data signal line, and a thin film transistor near the intersection of the gate signal line and the data signal line are formed on an insulating substrate. The thin film transistor comprises a plurality of gate electrodes extending from or electrically connected to the gate signal line, a gate insulating film, a semiconductor film extending so as to overlap with the plurality of gate electrodes and having a channel in each of overlaps with the plurality of gate electrodes, an interlayer insulating film, a planarization insulation film, and a conductive layer formed opposite to at least one of the channels with, at least, the interlayer insulating film between, and the width along the channel length of the conductive layer is narrower than the length of the at least one channel opposite to the conductive layer and narrower than the width along the channel length of the gate electrode corresponding to the channel.

According to another aspect of the present invention, the conductive layer in the above thin film transistor is connected to the gate electrode.

According to another aspect of the present invention, the potential of the conductive layer in the above thin film transistor is set to floating or constant potential.

According to another aspect of the present invention, in the above thin film transistor, an insulating film including the interlayer insulating film is formed between the conductive layer and the semiconductor film and the thickness of, at least, a region in the insulating film corresponding to the channel is 5,000 angstroms or more. In addition, the insulating film can be made of a single layer of a silicon oxide film, a silicon nitride film, or a film made of an organic material, or made of a laminate of any two or more of these films.

According to another aspect of the present invention, such a thin film transistor as has been described above is used in a display.

According to still another aspect of the present invention, such a thin film transistor as has been described above is what is called a bottom gate transistor, in which the gate electrode, the gate insulating film, the semiconductor film, the interlayer insulating film, and the conductive layer are formed on an insulating substrate in that order, or is what is called a top gate transistor, in which they are formed in the reverse order.

According to the present invention, as described above, a region over a channel in, for example, a bottom gate TFT is covered with a conductive layer with, at least, an interlayer insulating film between. If a TFT is used in a display (for example, as one for a display pixel in a liquid crystal display), there is a strong possibility that a region over a channel in a TFT is exposed to impurities during the manufacturing process of a display after the formation of the TFT. In a TFT according to the present invention, however, its channel is shielded by a conductive layer. Therefore, even if impurities or the like become attached to the top (for example, the surface of a planarization insulation film or an interlayer insulating film) of a TFT, a shift in its characteristics caused by a back channel can be prevented.

Furthermore, in a top gate TFT, for example, a conductive layer is arranged between a substrate and a semiconductor film. The position of this conductive layer formed on a substrate is adjusted so that it lies opposite to a channel with, at least, an interlayer insulating film between. That is, a channel in a semiconductor film is shielded by a conductive layer. Therefore, even if impurities become attached to the surface of a substrate when a TFT is manufactured or even if impurities diffuse from the surface of a substrate, a shift in characteristics of a TFT caused by a back channel occurring between a substrate and a channel is prevented.

Specially in a TFT according to the present invention, a conductive layer is formed so that its width along the length of a channel is narrower than the actual channel length and narrower than the width along the channel length of a gate electrode. As a result, the overlap of two regions outside a channel in a semiconductor film (that is, the junction portion of a source and a channel and the junction portion of a drain and a channel) and a conductive layer is reliably prevented. Degradation of characteristics of a TFT resulting from a leakage current in a semiconductor film caused by the potential of a conductive layer can therefore be prevented.

According to the present invention, as described above, a TFT with a stable threshold voltage can be provided and an increase in current consumed by a TFT can be curbed.

Furthermore, using such a TFT in a display can decrease current consumed by the display and can display images of high quality having uniform brightness all over by decreasing display defects, such as a bright point defect in which certain pixels remain permanantly bright.

DESCRIPTION OF THE PREFERRED EMBODIMENTS

A TFT according to the present invention will be described below.

Figure 1:
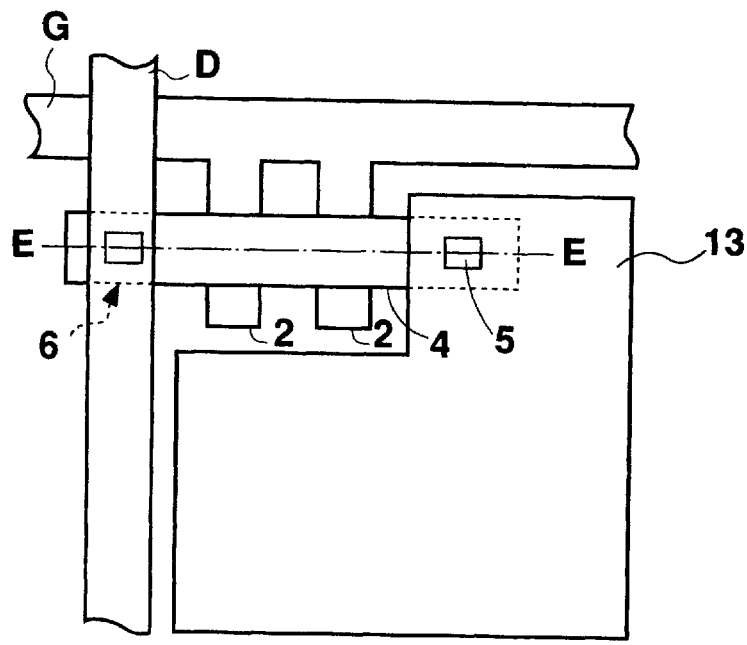
FIG. 1 is a plane view of a conventional TFT.
Figure 2:
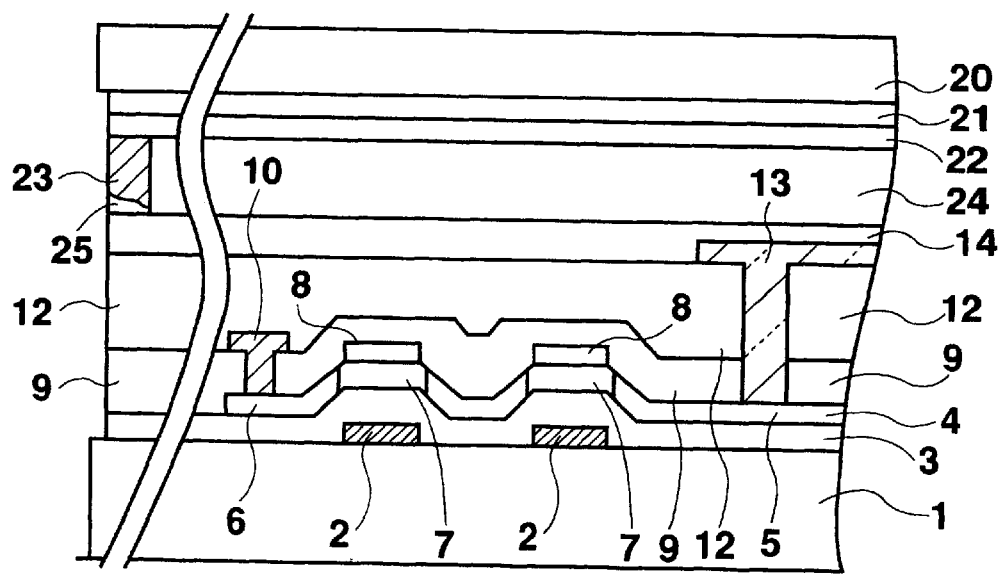
FIG. 2 is a cross-sectional view along E—E line in FIG. 1 of an LCD using such a TFT.
Figure 3:
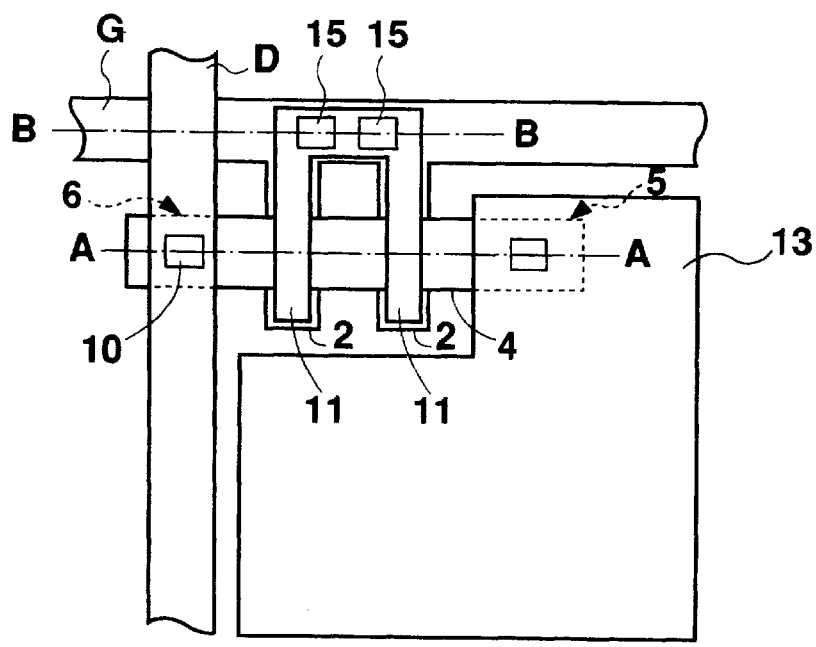
FIG. 3 is a plane view of a TFT in accordance with a preferred embodiment of the present invention.
Figure 4:
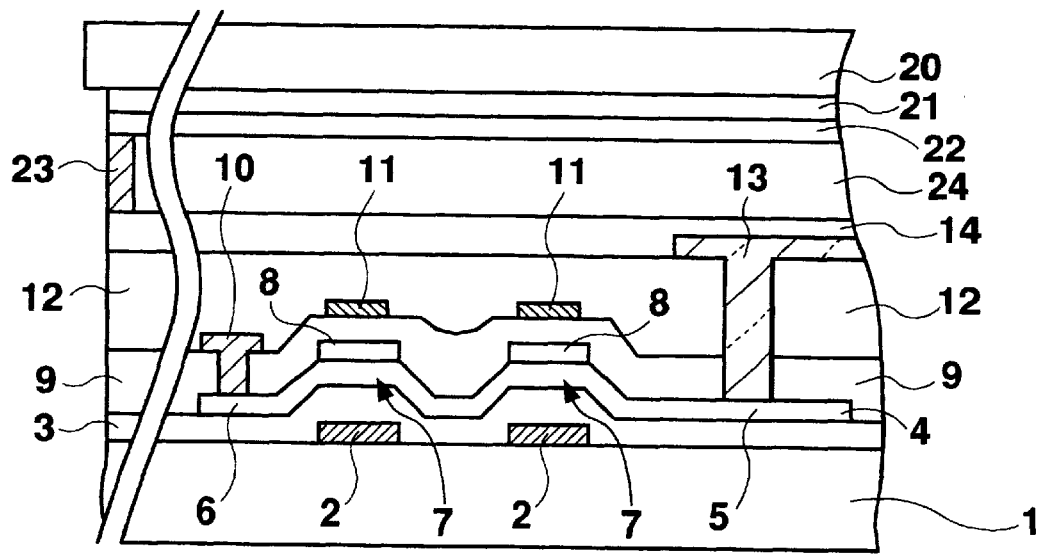
FIG. 4 is a cross-sectional view along A—A line in FIG. 3 of an LCD in accordance with a preferred embodiment of the present invention.
Figure 5:
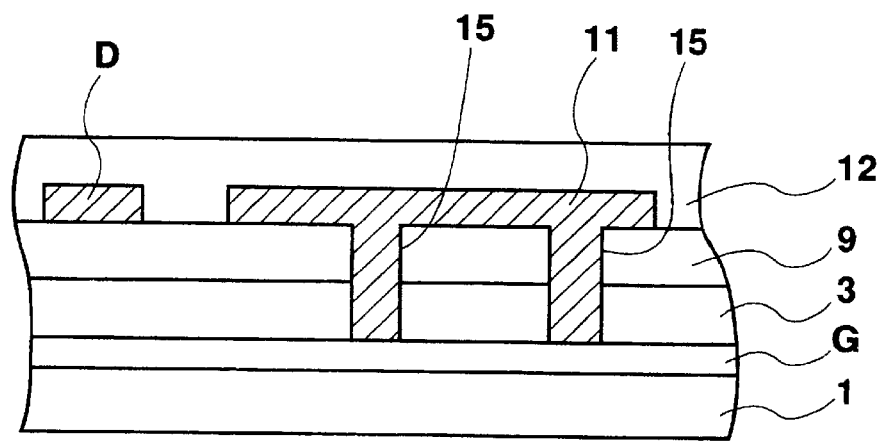
FIG. 5 shows the structure of a cross-section along B—B line in FIG. 3 of a TFT.

FIG. 3 is a plane view of a TFT according to the present invention used in a display pixel section; FIG. 4 is a cross-sectional view along A—A line in FIG. 3 of an LCD; FIG. 5 is a cross-sectional view along B—B line in FIG. 3 of the TFT.

As shown in FIG. 3, a TFT is formed near the intersection of gate signal line G also serving as a gate electrode 2 and drain signal line D also serving as a drain electrode 10. This TFT is connected to a display electrode 13.

As shown in FIG. 4, a gate electrode 2 made of a refractory metal (high melting point metal), such as Cr and Mo, a gate insulating film 3 made of an SiN film and an $SiO_2$ film, and an active layer (semiconductor film) 4 made of a poly silicon film are formed in that order on an insulating substrate I made of quartz glass, non-alkaline glass, or the like. A poly silicon film used as the active layer 4 may be made by forming an amorphous silicon film and then polycrystallizing it by treatment, such as laser annealing.

In the active layer 4, a channel 7 is formed in a region over the gate electrode 2 and a source 5 and a drain 6 are formed in regions with the channel 7 between by ion doping.

A stopper insulating film 8 made of an $SiO_2$ film is formed on the channel 7 so that it functions as a mask covering the channel 7 to prevent ions from entering the channel 7 when ion doping is performed to form the source 5 and the drain 6.

Furthermore, an interlayer insulating film 9 having an SiO$_2$ film, an SiN film, and an SiO$_2$ film layered is formed over the entire of the gate insulating film 3, the active layer 4, and the stopper insulating film 8. The interlayer insulating film 9 consists of a single layer of SiO, SiN, or an organic film made of an organic material, such as acrylic, or of multiple layers being a combination of these films.

Next, a drain electrode 10 is formed by filling a contact hole made in the interlayer insulating film 9, the position of which corresponds to the drain 6, with Al or a metal consisting of, for example, layered Mo and Al. Simultaneously with the drain electrode 10, a conductive layer 11 is formed in a region on the interlayer insulating film 9 over the channel 7. The conductive layer 11 is made of Al or a metal consisting of, for example, layered Mo and Al.

As shown in FIG. 5, the conductive layer 11 formed on the interlayer insulating film 9 is connected to the gate signal line G on the insulating substrate 1 via a contact hole 15 made in the gate insulating film 3 and the interlayer insulating film 9. The drain signal line D is formed on the interlayer insulating film 9. Furthermore, a planarization film 12 made of, for example, an organic resin is formed over the entire surface. A contact hole, the position of which corresponds to the source 5, is made in the planarization film 12 and a display electrode 13, which is a transparent electrode, is formed. The display electrode 13 is made of a transparent conductive material, such as ITO, in contact with the source 5 and also serves as a source electrode. An alignment film 14 for aligning liquid crystal 24 is formed on the display electrode 13.

The total thickness of insulating films (corresponding to the stopper insulating film 8 and the interlayer insulating film 9 in this preferred embodiment) between the conductive layer 11 and the active layer 4 should be 5,000 angstroms or more. This will increase the distance in the direction of film thickness between the conductive layer 11 and the active layer 4, which makes it possible to curb mutual electrical influence between them. In addition, it will increase the total thickness of films, which minimizes the probability that a pinhole will occur in an insulating film. As a result, characteristics of a TFT can be improved.

The insulating substrate 1 on which the TFT is formed, and an opposite substrate 20 having an opposite electrode 21 and an alignment film 22 opposite to the insulating substrate 1, are bonded together at their edges with a sealing adhesive 23 and a vacant space formed is filled with liquid crystal 24. An LCD is now completed.

A channel according to the present invention will be described with reference to FIGS. 6–8.

Figure 6:
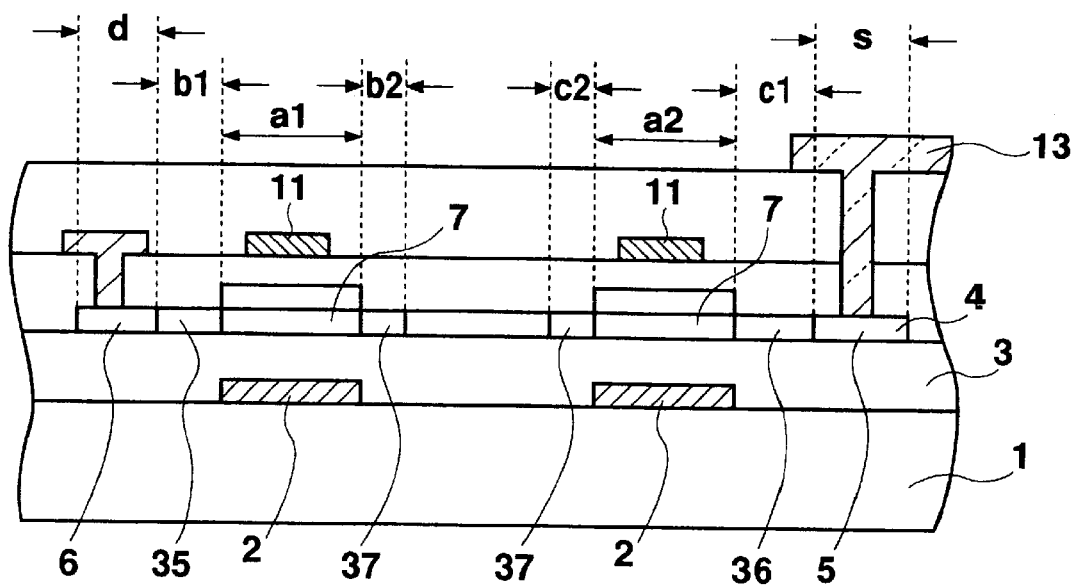
FIG. 6 shows the structure of a cross-section along A—A line in FIG. 3 of a TFT according to one aspect of the present invention.

FIG. 6 is a cross-sectional view along A—A line in FIG. 3 of a TFT having what is called an offset structure.

In the active layer 4 formed on the gate insulating film 3, the drain 6 (region d in FIG. 6) and the source 5 (region s in FIG. 6) are formed outside regions corresponding to the two gate electrodes 2 by doping ions in high concentration, as shown in FIG. 6. A region (region b1 in FIG. 6) between the drain 6 and the edge of the region corresponding to the gate electrode 2, a region (region c1 in FIG. 6) between the source 5 and the edge of the region corresponding to the gate electrode 2, and regions (regions b2 and c2 in FIG. 6) between the regions corresponding to the two gate electrodes 2 are what are called offset regions 35, 36, and 37 where ions are not doped. A channel is a region in the active layer 4 which overlaps with the gate electrode 2. In a TFT having such a structure, a region in the active layer 4 over the gate electrode 2 is the channel 7 and a1 and a2 in FIG. 6 represent the length of the channel 7 in the present invention.

Figure 7:
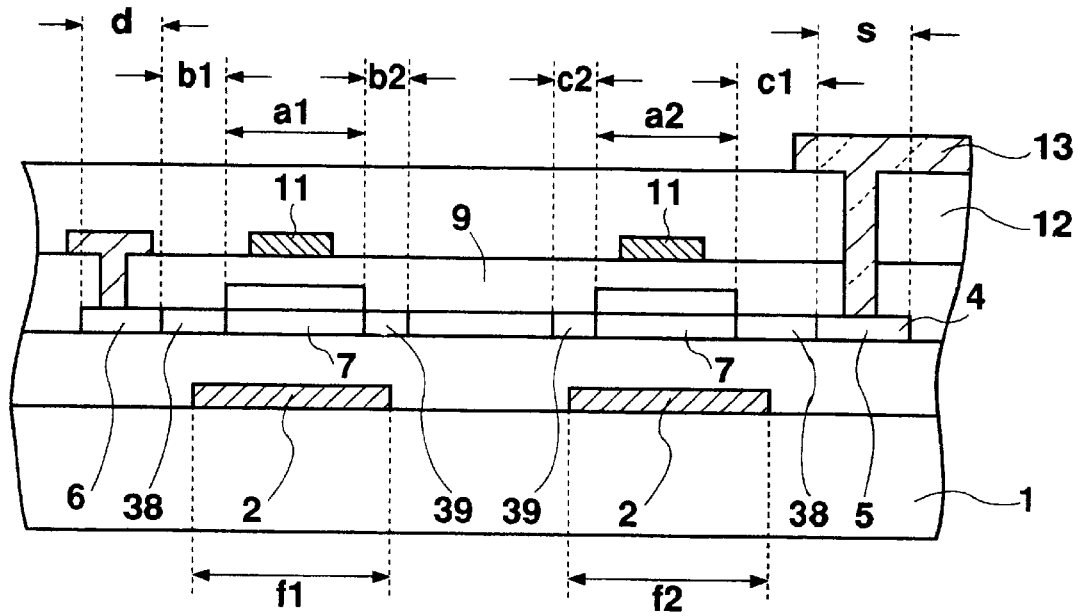
FIG. 7 shows the structure of a cross-section along A—A line in FIG. 3 of a TFT according to another aspect of the present invention.

FIG. 7 is a cross-sectional view along A—A line in FIG. 3 of a TFT having what is called lightly-doped drain (LDD) structure.

In the active layer 4, as shown in FIG. 7, the drain 6 (region d in FIG. 7) and the source 5 (region s in FIG. 7) are formed outside regions corresponding to the two gate electrodes 2 by doping ions in high concentration. A region (region b1 in FIG. 7) between the drain 6 and the edge of the region corresponding to the gate electrode 2, a region (region c1 in FIG. 7) between the source 5 and the edge of the region corresponding to the gate electrode 2, and regions (regions b2 and c2 in FIG. 7) between the regions corresponding to the two gate electrodes 2 are what are called LDD regions where ions were doped in low concentration. A region in the active layer 4 between the LDD regions 38 and 39 is the channel 7. In addition, a1 and a2 in FIG. 7 represent the length of the channel 7 in the present invention.

Figure 8:
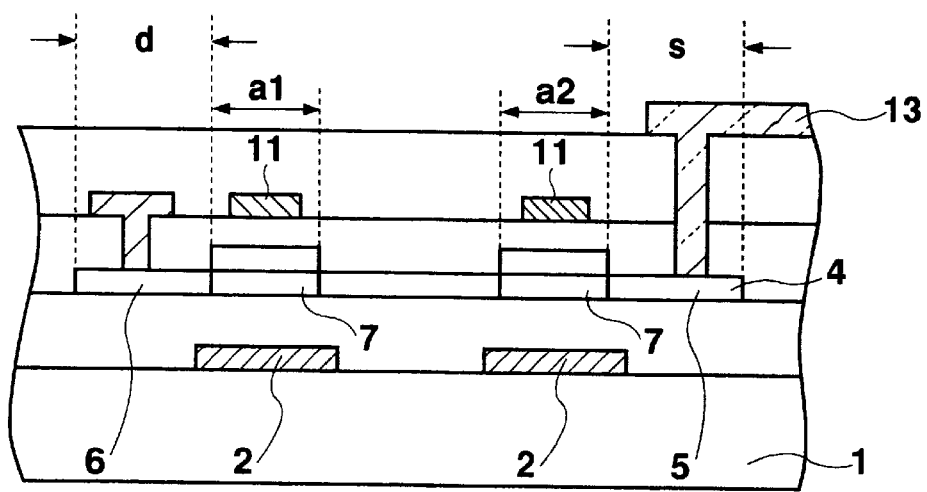
FIG. 8 shows the structure of a cross-section along A—A line in FIG. 3 of a TFT according to still another aspect of the present invention.

FIG. 8 is a cross-sectional view along A—A line in FIG. 3 of a TFT which has a source, a drain, and a channel in its active layer and does not have an LDD or offset structure.

In the active layer 4, as shown in FIG. 8, the drain 6 (region d in FIG. 8) and the source 5 (region s in FIG. 8) are formed outside regions corresponding to the two gate electrodes 2 by doping ions in high concentration. In this structure, the channel 7 is between the drain 6 and the source 5. Furthermore, a1 and a2 in FIG. 8 represent the length of the channel 7 in the present invention.

As shown in FIGS. 3 and 4, the conductive layer 11 overlaps with the gate electrode 2, which is part of the gate signal line G, and the channel 7 formed over the gate electrode 2. The edge of the conductive layer 11, however, does not match those of the gate electrode 2 and the channel 7. That is to say, the edge of the conductive layer 11 lies nearer to the center than that of the channel 7 along its length and that of the gate electrode 2 along the channel length.

Effects obtained by forming the conductive layer 11, the gate electrode 2, and the channel 7 so that the edge of the conductive layer 11 does not match those of the gate electrode 2 and the channel 7 will be described below with a TFT having LDD regions as an example.

In FIG. 7, if a width of the conductive layer 11 is equal to or greater than the channel length "a" and the conductive layer 11 overlaps with an LDD region and, as in this preferred embodiment, the conductive layer 11 is connected to the gate electrode 2, strong electric fields occur in a region where the conductive layer 11 and the LDD region overlap and a leakage current and electric charges occur between the conductive layer 11 and the active layer 4 via the interlayer insulating film 9. This results in degradation of characteristics of a TFT. It is possible to make the interlayer insulating film 9 high-quality, for example, by making it finer in order to curb the occurrence of such a leakage current. However, this will lead to degradation of throughput because, for example, it takes a longer time to form a film.

Furthermore, if the conductive layer 11 and the LDD region overlap, capacitance (parasitic capacitance) between the gate and the source will increase.

In the present invention, however, degradation of characteristics and an increase in capacitance described above can be curbed by making the width of the conductive layer 11 narrower than that of the channel 7 and the gate electrode 2, or channel length "a", and preventing the conductive layer 11 overlapping with the edge of the channel 7 and the edge of the gate electrode 2. The same problem will arise when the conductive layer 11 overlaps with an offset region or when the conductive layer 11 overlaps with the source 5 and the drain 6. In the present invention, therefore, the width along a channel length of the conductive layer 11 is made narrower than the channel length. As shown in FIG. 6, this prevents the conductive layer 11 overlapping with the offset regions 35, 36, and 37 and prevents, as shown in FIG. 8, the conductive layer 11 overlapping with the source 5 and the drain 6. As a result, the same effect as with the above LDD structure will be obtained.

As stated above, impurities can be prevented from attaching to the surface of an interlayer insulating film by forming a conductive layer which has a width narrower than a channel length and the width along the channel length of a gate electrode, and which does not overlap with the edges of the channel and the gate electrode. This prevents electric charges from accumulating on the surface of an interlayer insulating film and provides a TFT with a stable threshold voltage. As a result, the bright point defect and others are improved and an LCD capable of displaying images with uniform brightness all over can be obtained.

Figure 9:
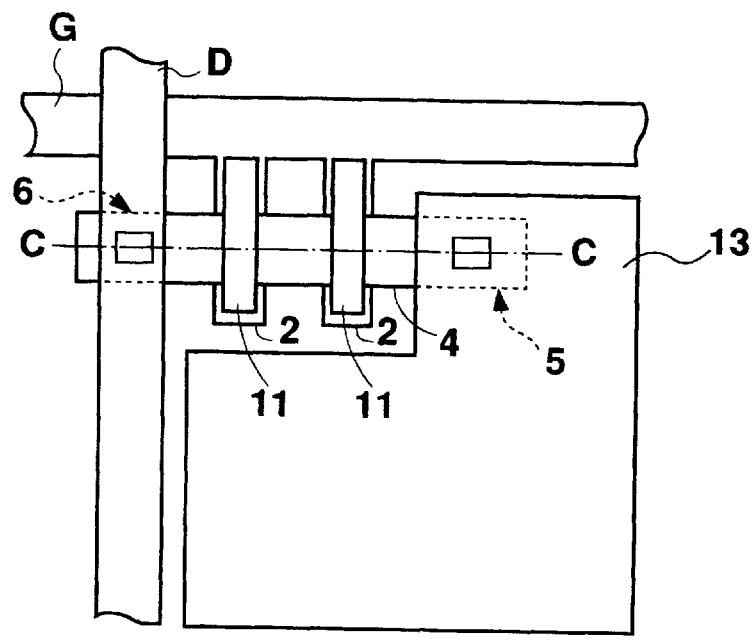
FIG. 9 is a plane view of a TFT according to another aspect of the present invention the structure of a cross-section along C—C line of which corresponds to that in FIGS. 6, 7 or 8.

In FIG. 9, the conductive layer 11 is not connected to the gate electrode 2 and therefore has a floating potential. This is different from the first preferred embodiment, but the same effect as with the first preferred embodiment is obtained. A cross-sectional view along C—C line in FIG. 9 of a TFT is the same as that of the above FIGS. 6–8.

The conductive layer 11 is formed on the interlayer insulating film 9 and its width along a channel length is narrower than the length of the channel 7, or a, and the width along the channel length of the gate electrode 2. In addition, the conductive layer 11 is formed so that its edge does not overlap with the edges of the channel 7 and the gate electrode 2.

The above effect can be obtained by further forming a constant-potential supply line in a TFT according to the present invention to make the potential of the conductive layer 11 constant. For example, earth potential or a potential of several volts is used as constant potential.

Furthermore, in what is called a double gate structure having two gate electrodes, an effect is obtained by forming a conductive layer, the width of which is narrower than the length of a channel corresponding to one of the two gate electrodes, on this gate electrode.

In addition, an effect obtained by forming a conductive layer on an interlayer insulating film can be achieved by forming a conductive layer on a planarization insulation film. However, if a bottom gate TFT in which a conductive layer and a gate electrode have the same potential is used as a switching element in a planar display, such as an LCD, a conductive layer, as shown in FIGS. 4–8, should be formed on the interlayer insulating film 9 in order to, for example, minimize the influence of electric fields caused by the conductive layer on a liquid crystal layer. If the alignment film 14 is thick enough, forming the conductive layer 11 on the planarization insulation film 12 will naturally cause no problem.

Also, insulating films, such as a stopper insulating film, an interlayer insulating film, and a planarization insulation film in each preferred embodiment, formed between a conductive layer and an active layer, may consist of a single layer of an SiO film, an SiN film, or an organic film or consist of multiple layers made of these films.

In this preferred embodiment, an explanation has been given of what is called a bottom gate TFT in which a gate electrode is below an active layer. However, the same effect can be obtained by applying the present invention to what is called a top gate TFT in which a gate electrode is over an active layer.

Figure 10:
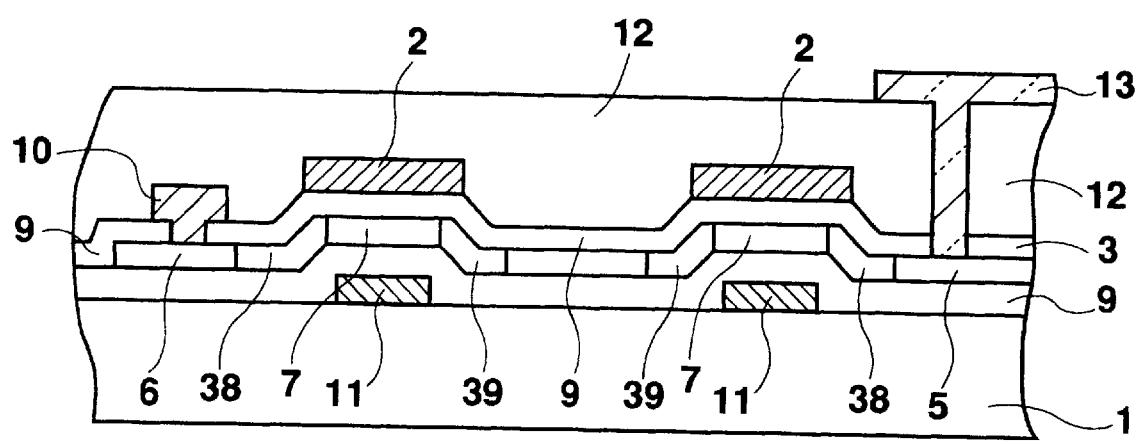
FIG. 10 shows the structure of a cross-section along A—A line in FIG. 3 or C—C line in FIG. 9 of a TFT according to another aspect of the present invention.

FIG. 10 shows the structure of a cross-section along A—A line in FIG. 3 or C—C line in FIG. 9 of a top gate TFT. Portions common to FIG. 10 and FIGS. 1–9 which have already been described have the same reference numerals. In a top gate TFT, the gate electrode 2 is over the channel 7 in the active layer 4, as shown in FIG. 10. A back channel, therefore, should not occur at the top of a TFT. On the other hand, impurities between the insulating substrate 1 and the active layer 4 may cause a back channel in the substrate side (at the bottom) of a TFT. Therefore, the conductive layer 1 is formed between the insulating substrate 1 and the active layer 4, or more specifically, between the insulating substrate 1 and the interlayer insulating film 9 so that the channel 7 in the active layer 4 formed on the interlayer insulating film 9 and the conductive layer 11 are arranged opposite to each other. A cross-sectional view in FIG. 10 shows a TFT of LDD type, but the structure of TFTs is not limited to LDD type. The offset structure shown in FIG. 6 and a standard structure shown in FIG. 8 can be adopted.

In each of the above preferred embodiments, a case where a TFT according to the present invention is used as a TFT for a display pixel in an LCD has been described, but the present invention is not limited to this case. The present invention can also be applied to, for example, a TFT in a driver section (other than a TFT for a display pixel) in an LCD and an organic electroluminescence (EL) display. With a TFT in a driver section in an LCD, an electrode made of a metal, such as aluminum, is used, as with the drain electrode 10, as the source electrode 13 in place of the transparent electrode 13 shown in each Figure. It goes without saying that the liquid crystal layer 24, the alignment films 14 and 22, the common electrode 21, the opposite substrate 20, etc., shown in FIG. 4 need not exist over this TFT. With an organic EL display, a TFT having the above structure can be adopted, for example, as a pixel TFT formed for operating each EL display pixel in a display section and/or as a TFT in a driver section formed on a substrate, on which each pixel TFT is also formed, for operating each pixel TFT. An organic EL display has a structure in which organic layers including a luminescent layer are formed between the electrodes 13 and 21 in place of the alignment films 14 and 22 and the liquid crystal layer 24 in FIG. 4. The opposite substrate 20 is not necessary. By adopting such a TFT, the same effect as described above can be achieved.

While what have been described are, at present, considered to be preferred embodiments of the invention, it will be understood that various modifications may be made thereto, and it is intended that the appended claims cover all such modifications falling within the true spirit and scope of the invention.

What is claimed is:

1. A thin film transistor, comprising:

an insulating substrate;

a gate electrode;

a gate insulating film;

a semiconductor film having a channel;

an interlayer insulating film; and a planarization insulation film;

wherein the gate electrode, the gate insulating film, the semiconductor film having a channel, the interlayer insulating film, and the planarization insulation film are formed on the insulating substrate, wherein a conductive layer is formed opposite to the channel in the semiconductor film with, at least, the interlayer insulating film between, and wherein the width of the conductive layer along the length of the channel is narrower than the length of the channel, and the edge along the channel length of the conductive layer does not overlap with the edge along the channel length of the gate electrode or the edge along the channel length of the channel, and wherein the conductive layer is connected to the gate electrode.

2. The thin film transistor according to claim 1, wherein an insulating film including the interlayer insulating film is formed between the conductive layer and the semiconductor film and wherein the thickness of, at least, a region in the insulating film corresponding to the channel is 5,000 angstroms or more.

3. The thin film transistor according to claim 2, wherein the insulating film is made of a single layer of a silicon oxide film, a silicon nitride film, or a film made of an organic material, or is made of a laminate of any two or more of these films.

4. A display having the thin film transistor according to claim 1.

5. The thin film transistor according to claim 1, wherein the gate electrode, the gate insulating film, the semiconductor film, the interlayer insulating film, and the conductive layer are formed on an insulating substrate in that order or in a reverse order.

6. A thin film transistor, comprising:
   an insulating substrate;
   a gate electrode;
   a gate insulating film;
   a semiconductor film having a channel; and
   an interlayer insulating film,
   wherein the gate electrode, the gate film, the semiconductor film having a channel, and the interlayer insulating film are formed on the insulating substrate, wherein a conductive layer is formed opposite to the channel in the semiconductor film with, at least, the interlayer insulating film between, and wherein the width of the conductive layer along the length of the channel is narrower than the length of the channel and narrower than the width along the channel length of the gate electrode, and wherein the conductive layer is connected to the gate electrode.

7. The thin film transistor according to claim 6, wherein an insulating film including the interlayer insulating film is formed between the conductive layer and the semiconductor film and wherein the thickness of, at least, a region in the insulating film corresponding to the channel is 5,000 angstroms or more.

8. The thin film transistor according to claim 7, further comprising a planarization insulation film formed on the interlayer insulating film.

9. A display having the thin film transistor according to claim 6.

10. The thin film transistor according to claim 6, wherein the gate electrode, the gate insulating film, the semiconductor film, the interlayer insulating film, and the conductive layer are formed on an insulating substrate in that order or in a reverse order.

11. A thin film transistor, comprising:
    an insulating substrate;
    a gate signal line;
    a data signal line; and
    a thin film transistor near the intersection of the gate signal line and the data signal line,
    wherein the gate signal line, the data signal line, and the thin film transistor near the intersection of the gate signal line and the data signal line are formed on the insulating substrate, the thin film transistor comprising:
    a plurality of gate electrodes extending from or electrically connected to the gate signal line;
    a gate insulating film;
    a semiconductor film extending so as to overlap with the plurality of gate electrodes and having a channel in each of overlaps with the plurality of gate electrodes;
    an interlayer insulating film;
    a planarization insulation film; and
    a conductive layer formed opposite to at least one of the channels with, at least, the interlayer insulating film between,
    wherein the width along the channel length of the conductive layer is narrower than the length of the at least one channel overlapping with the conductive layer and than the width along the channel length of the corresponding gate electrode, and wherein the conductive layer is electrically connected to the gate signal line.

12. The semiconductor device according to claim 11, wherein an insulating film including the interlayer insulating film is formed between the conductive layer and the semiconductor film and wherein the thickness of, at least, a region in the insulating film corresponding to the channel is 5,000 angstroms or more.

13. A display having the thin film transistor according to claim 11.

14. The thin film transistor according to claim 11, wherein the plurality of a gate electrode, the gate insulating film, the semiconductor film, the interlayer insulating film, and the conductive layer are formed on an insulating substrate in that order or in a reverse order.

15. A thin film transistor, comprising:
    an insulating substrate;
    a gate electrode;
    a gate insulating film;
    a semiconductor film having a channel;
    an interlayer insulating film; and
    a planarization insulation film;
    wherein the gate electrode, the gate insulating film, the semiconductor film having a channel, the interlayer insulating film, and the planarization insulation film are formed on the insulating substrate, wherein a conductive layer is formed opposite to the channel in the semiconductor film with, at least, the interlayer insulating film between, and wherein the width of the conductive layer along the length of the channel is narrower than the length of the channel, and the edge along the channel length of the conductive layer does not overlap with the edge along the channel length of the gate electrode or the edge along the channel length of the channel, and wherein the entire channel width is covered with the conductive layer, and wherein the conductive layer is connected to the gate electrode.

16. The thin film transistor according to claim 15, wherein an insulating film including the interlayer insulating film is formed between the conductive layer and the semiconductor film and wherein the thickness of, at least, a region in the insulating film corresponding to the channel is 5,000 angstroms or more.

17. The thin film transistor according to claim 16, wherein the insulating film is made of a single layer of a silicon oxide film, a silicon nitride film, or a film made of an organic material, or is made of a laminate of any two or more of these films.

18. A display having the thin film transistor according to claim 15.

19. The thin film transistor according to claim 15, wherein the gate electrode, the gate insulating film, the semiconductor film, the interlayer insulating film, and the conductive layer are formed on an insulating substrate in that order or in a reverse order.

20. A thin film transistor, comprising:

an insulating substrate;

a gate electrode;

a gate insulating film;

a semiconductor film having a channel; and an interlayer insulating film, wherein the gate electrode, the gate insulating film, the semiconductor film having a channel, and the interlayer insulating film are formed on the insulating substrate, wherein a conductive layer is formed opposite to the channel in the semiconductor film with, at least, the interlayer insulating film between, and wherein the width of the conductive layer along the length of the channel is narrower than the length of the channel and narrower than the width along the channel length of the gate electrode, and wherein the entire channel width is covered with the conductive layer, and wherein the conductive layer is connected to the gate electrode.

21. The thin film transistor according to claim 20, wherein an insulating film including the interlayer insulating film is formed between the conductive layer and the semiconductor film and wherein the thickness of, at least, a region in the insulating film corresponding to the channel is 5,000 angstroms or more.

22. The thin film transistor according to claim 21, further comprising a planarization insulation film formed on the interlayer insulating film.

23. A display having the thin film transistor according to claim 20.

24. The thin film transistor according to claim 20, wherein the gate electrode, the gate insulating film, the semiconductor film, the interlayer insulating film, and the conductive layer are formed on an insulating substrate in that order or in a reverse order.

25. A semiconductor device, comprising:

an insulating substrate;

a gate signal line;

a data signal line; and a thin film transistor near the intersection of the gate signal line and the data signal line, wherein the gate signal line, the data signal line, and the thin film transistor near the intersection of the gate signal line and the data signal line are formed on the insulating substrate, the thin film transistor comprising:

a plurality of hate electrodes extending from or electrically connected to the gate signal line;

a gate insulating film;

a semiconductor film extending so as to overlap with the plurality of gate electrodes and having a channel in each of overlaps with the plurality of gate electrodes;

an interlayer insulating film;

a planarization insulation film; and a conductive layer formed opposite to at least one of the channels with, at least, the interlayer insulating film between, wherein the width along the channel length of the conductive layer is narrower than the length of the at least one channel overlapping with the conductive layer and than the width along the channel length of the corresponding gate electrode, and wherein the entire channel width is covered with the conductive layer, and wherein the conductive layer is electrically connected to the gate signal line.

26. The semiconductor device according to claim 25, wherein an insulating film including the interlayer insulating film is formed between the conductive layer and the semiconductor film and wherein the thickness of, at least, a region in the insulating film corresponding to the channel is 5,000 angstroms or more.

27. A display having the thin film transistor according to claim 25.

28. The thin film transistor according to claim 25, wherein the plurality of a gate electrode, the gate insulating film, the semiconductor film, the interlayer insulating film, and the conductive layer are formed on an insulating substrate in that order or in a reverse order.

* * * * *

UNITED STATES PATENT AND TRADEMARK OFFICE
CERTIFICATE OF CORRECTION

PATENT NO. : 6,252,248 B1
DATED : June 26, 2001
INVENTOR(S) : Sano et al.

It is certified that error appears in the above-identified patent and that said Letters Patent is hereby corrected as shown below:

Column 1,
Lines 10 and 29, after "a" delete "poly silicon" and insert therefor -- polysilicon --
Line 43, after "planarization" insert therefor -- of --

Column 3,
Line 53, before "in" delete "Specially" and insert therefor -- Especially --

Column 4,
Lines 8, 12, 28 and 41 after "a" (first occurrence) delete "plane" and insert therefor -- plan --
Line 54, before "film" delete "poly silicon" and insert therefor -- polysilicon --
Line 56, after "A" delete "poly silicon" and insert therefor -- polysilicon --

Column 8,
Line 10, after "layer" delete "1" and insert therefor -- 11 --

Column 12,
Line 9, after "of" delete "hate" and insert therefor -- gate --

Signed and Sealed this

Eleventh Day of January, 2005

JON W. DUDAS
*Director of the United States Patent and Trademark Office*